United States Patent
Hopper et al.

(10) Patent No.: US 6,964,907 B1
(45) Date of Patent: Nov. 15, 2005

(54) METHOD OF ETCHING A LATERAL TRENCH UNDER AN EXTRINSIC BASE AND IMPROVED BIPOLAR TRANSISTOR

(75) Inventors: Peter J. Hopper, San Jose, CA (US); Alexei Sadovnikov, Sunnyvale, CA (US); Vladislav Vashchenko, Palo Alto, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/716,276

(22) Filed: Nov. 17, 2003

(51) Int. Cl.[7] .................. H01L 21/331; H01L 21/302
(52) U.S. Cl. .................... 438/318; 438/319; 438/353; 438/355; 438/359; 438/739; 257/517; 257/521; 257/524

(58) Field of Search ................. 438/318, 353, 438/355, 359, 739–740, 319; 257/517, 521, 257/524

(56) References Cited

U.S. PATENT DOCUMENTS

| 4,196,440 A | * | 4/1980 | Anantha et al. ............ 257/557 |
| 4,685,198 A | * | 8/1987 | Kawakita et al. ........... 438/410 |

* cited by examiner

*Primary Examiner*—Donghee Kang
(74) *Attorney, Agent, or Firm*—Jurgen Vollrath

(57) ABSTRACT

In a BJT, the extrinsic base to collector capacitance is reduced by forming a lateral trench between the extrinsic base region and collector. This is typically done by using an anisotropic wet etch process in a <110> direction of a <100> orientation wafer.

6 Claims, 4 Drawing Sheets

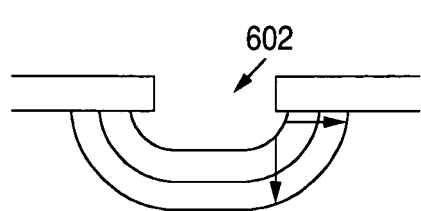
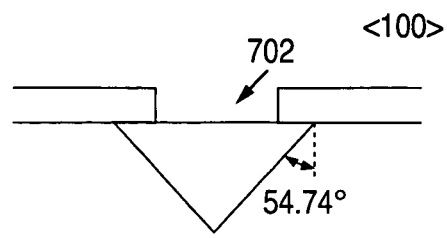
FIG. 6
(PRIOR ART)
FIG. 7
(PRIOR ART)
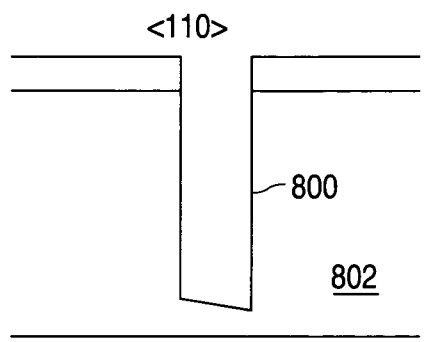
FIG. 8
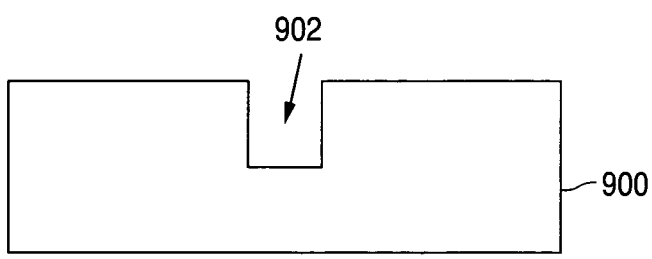
FIG. 9
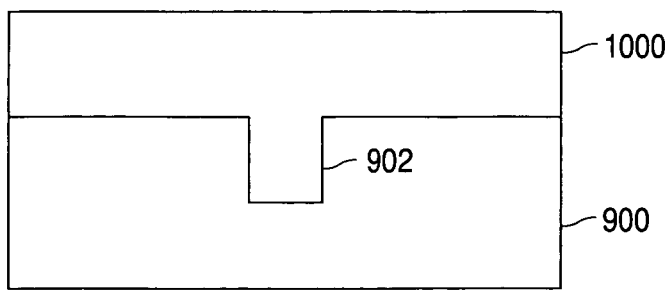
FIG. 10

US 6,964,907 B1

METHOD OF ETCHING A LATERAL TRENCH UNDER AN EXTRINSIC BASE AND IMPROVED BIPOLAR TRANSISTOR

FIELD OF THE INVENTION

The invention relates to bipolar transistor. In particular, it relates to a bipolar transistor with reduced base-collector parasitic capacitance.

BACKGROUND OF THE INVENTION

In the case of bipolar transistors formed in an integrated circuit (IC) where the base of the transistor is contacted through a contact on the surface of the IC, the base typically includes one or two extrinsic base regions, as illustrated in FIG. 1. The typical BJT 100 shown in FIG. 1 includes an emitter 102 contacted by emitter metal 104, a base 106 with extrinsic base regions 108, and a collector 110. The BJT 100 is isolated from surrounding structures by isolation regions 112. The extended extrinsic base regions 108 however form a large junction area with the collector 110, which results in significant parasitic capacitance between the extrinsic base regions 108 and the collector 110. For convenience, this is simply referred to as the base-collector capacitance. It will be appreciated that the parasitic capacitance has a significant effect on fMax (the maximum frequency at which the device can practically be operated) and fT (the cut-off frequency where voltage gain is unity). It would therefore be desirable to be able to increase fMax and fT.

SUMMARY OF THE INVENTION

The present invention proposes a bipolar transistor (BJT) with reduced base-collector capacitance comprising a BJT with extrinsic base, at least one vertical trench for lateral isolation and a lateral trench extending from at least one of the vertical trenches, which may me filled with air or an insulator. This may be PETEOS or a similar high step coverable insulating material.

The vertical trench requires a <110> sidewall orientation in a <100> silicon wafer.

Further, according to the invention, there is provided a method of forming a laterally extending trench underneath an extrinsic base of a BJT, comprising making use of the natural crystal orientation for the semiconductor material in which the BJT is formed and accordingly choosing a predetermined crystal configuration, and using an anisotropic etchant to etch the trench. The semiconductor material may be silicon and the crystal configuration is preferably a standard <100> configuration. The laterally extending trench therefore preferably has an orientation of <110>. The etchant is preferably a wet anisotropic silicon etchant such as KOH, typically with alcohol such as ethanol, and water. It may also be another type of wet anisotropic etchant such as TMAH.

BRIEF DESCRIPTION OF THE DRAWINGS

FIG. 6 shows a typical isotropic etch profile,

FIG. 7 shows a typical anisotropic etch profile in a <100> direction,

FIG. 8 shows a typical anisotropic etch profile in a <110> direction, and

FIGS. 9–16 show the steps of forming a laterally extending isolation trench in accordance with one embodiment of the invention.

DETAILED DESCRIPTION OF THE INVENTION

Figure 1:
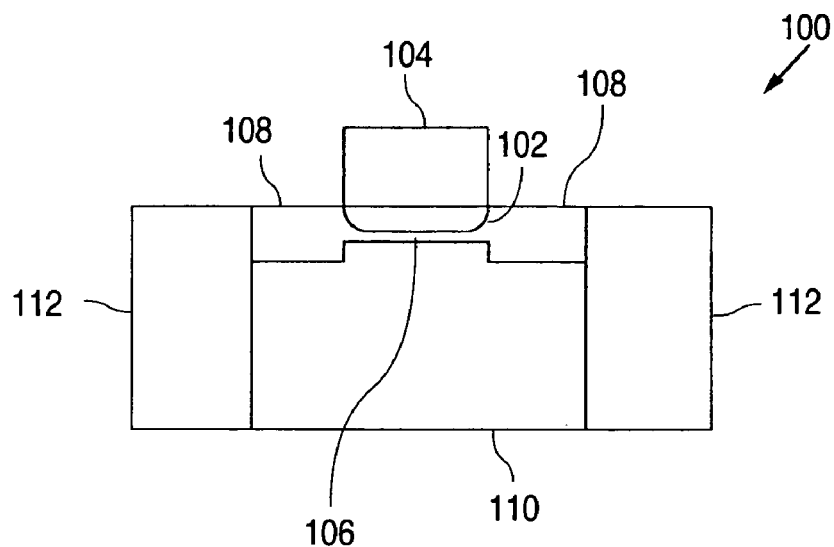
FIG. 1 is a section through a typical BJT in an integrated circuit.
Figure 2:
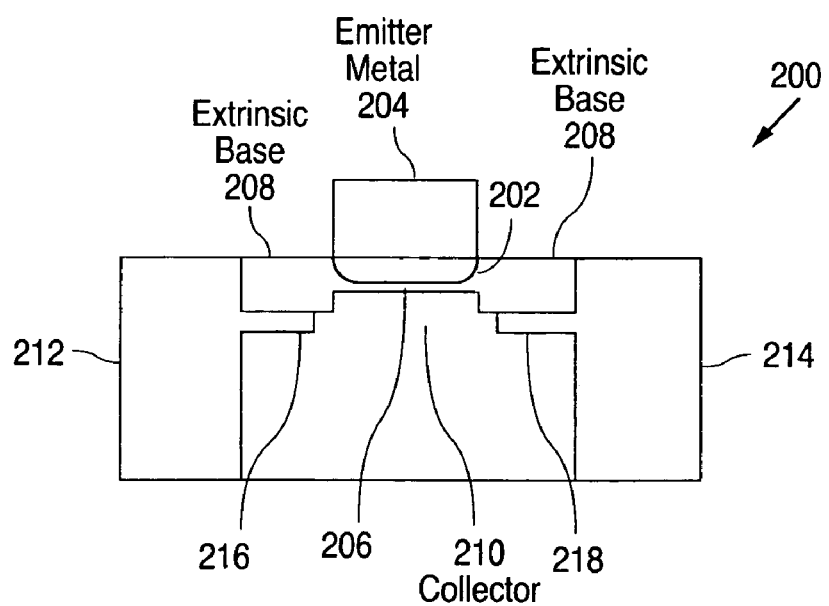
FIG. 2 is a section through a one embodiment of a BJT of the invention.

It has been determined that by providing an isolation region between the extrinsic base and the collector of a BJT, the base-collector parasitic capacitance can be improved to achieve an improved fMax and fT for the BJT device. In order to achieve this, one approach adopted by the applicants as part of the present invention is to etch a lateral trench underneath the extrinsic base that extends at least partially under the extrinsic base. It will be appreciated that in the case such as the device 100, having extrinsic base regions extending on either side of the base 106, an isolation trench is preferably formed underneath each of the two extrinsic base regions 108. Such an embodiment is illustrated in FIG. 2 which shows a BJT 200 having an emitter 202 contacted by emitter metal 204, intrinsic base 206 with extrinsic base regions 208 extending on either side of the intrinsic base 206, and a collector 210. The BJT 200 is isolated from adjacent structures by shallow trench isolation (STI) regions 212, 214. In addition, the present invention provides for a laterally extending trench 216 extending from the one vertical STI region 216, partially underneath the one extrinsic base region 208. Similarly, a laterally extending trench 218 extends from the other vertical STI region 214, partially underneath the other extrinsic base region 208.

Another aspect of the invention relates to the manner in which the laterally extending isolation regions, such as the trenches 216, 218 in FIG. 2 are formed. The present invention makes use of the natural crystal orientation of the semiconductor material in which the BJT is formed, and a specific etchant type to achieve the desired configuration of the laterally extending trenches between the extrinsic base regions and the collector.

Figure 3:
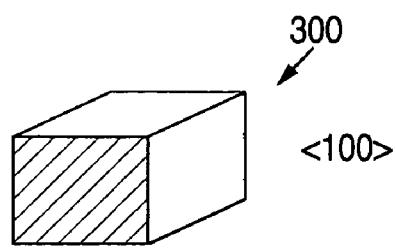
FIGS. 3–5 shows three crystal orientations.
Figure 4:
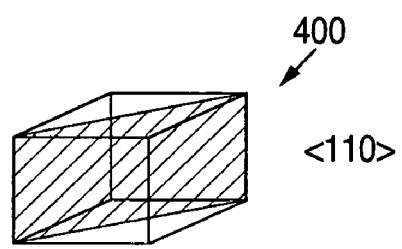
Figure 5:
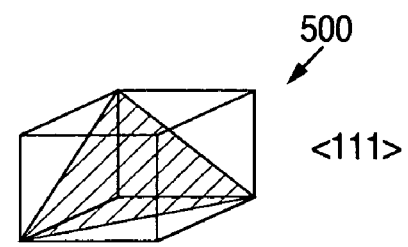

Crystals, such as silicon crystals, have a particular configuration that is determined by the way the atoms in the crystal are aligned. For ease of reference, terminology has evolved to define three basic configurations: <100><110><111>. These are best understood with reference to FIGS. 3, 4 and 5, respectively. This is discussed in more detail in "Physics of Semiconductor Devices" by S. M. Sze (see in particular on page 10), which is incorporated by reference herein. Typically BJTs are formed in silicon wafers that are grown to have a crystal orientation of <111> for the top surface. In contrast MOS and BiCMOS devices are typically formed <100> orientation wafers (in the case of BiCMOS SiGe is typically used). The present invention proposes using a <100> silicon wafer (top surface having a <100> crystal orientation) and forming the laterally extending isolation trenches between the extrinsic base regions and collector in a <110> direction. By doing this in conjunction with an anisotropic etch process, the desired isolation trench, such as the trenches 216, 218 were found to be achievable. In particular, in one embodiment, an anisotropic wet etch using KOH with alcohol and water was found to work well. In this embodiment ethanol was used for the alcohol. In another embodiment TMAH was used as the wet anisotropic etchant.

FIG. 6 shows the typical etch profile for isotropic etchants. As can be seen, etching the silicon 600 through a window 602 results in substantially similar etching in the vertical and the lateral directions. FIG. 7 contrasts this with the use of a wet anisotropic etchant such as KOH with alcohol and water when etching through a window 702 in a silicon wafer 700 having a <100> crystal orientation. This provides an etch profile where the trench has an angle of 54.74° as shown in FIG. 7. However, when combining the wet anisotropic etchant with a crystal orientation <110> a trench with very steep vertical sides and negligible lateral etching is achieved as shown in FIG. 8. FIG. 8 shows a deep, narrow trench 800 formed in a silicon wafer 802 having a <110> orientation.

Using this concept, the present invention makes use of a <100> orientation wafer; thereby having the <110> crystal orientation in both the lateral and vertical directions with respect to the wafer flat or notch. Thus, the rectangular mask opening, used to form the vertical trench is formed such that its rectangular opening, in the plane of the wafer, is oriented similarly, either perpendicular or parallel to the wafer flat or notch. This allows deep lateral trenches to be etched using a wet anisotropic etchant. Preferably a plasma/dry etch is used for etching the vertical trench.

The process of forming one embodiment of a BJT of the invention will now be discussed in more detail with respect to FIGS. 9–16.

FIG. 9 shows a silicon substrate 900 having a <100> orientation. A shallow trench 902 is etched into this substrate using, standard techniques for forming a shallow trench isolation (STI) region. As will become clearer below, the trench 902, will ultimately serve to form one of the STI regions (such as STI 212 or 214 in the FIG. 2 embodiment).

An organic fill material 1000 such as BCB, polyamide, Perspex, etc, is then deposited on the silicon 900 to fill the trench 902, as shown in FIG. 10.

Figure 11:
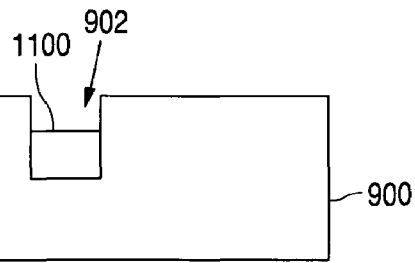

As shown in FIG. 11, the organic fill 1000 is then etched back to leave an organic fill plug 1100 in the bottom of the trench 902. Preferably an oxygen based plasma is used for etching back the organic fill.

Figure 12:
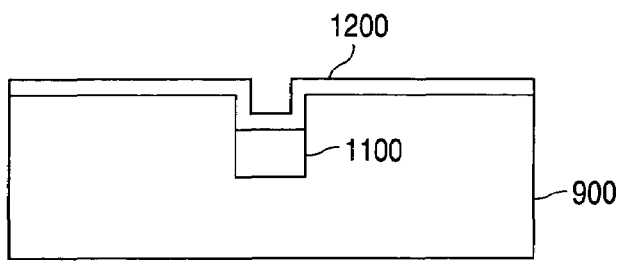
Figure 13:
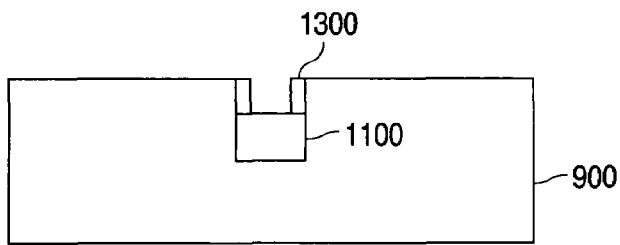

A plasma enhanced TEOS (PETEOS) 1200 is then deposited as shown in FIG. 12, whereafter the excess PETEOS is etched away, leaving a spacer sidewall, as shown in FIG. 13. In this embodiment a reactive ion etch (RIE) was used to etch away the excess PETEOS to leave the PETEOS spacer 1300.

Figure 14:
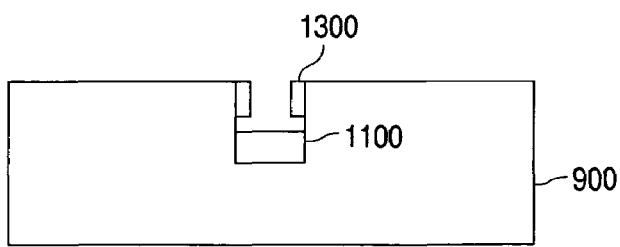

Thereafter, more of the organic fill plug 1100 is etched away using, for example, $O_2$ plasma or wet etch. This is shown in FIG. 14, and leaves a short lateral undercut under the PETEOS spacer 1300.

Figure 15:
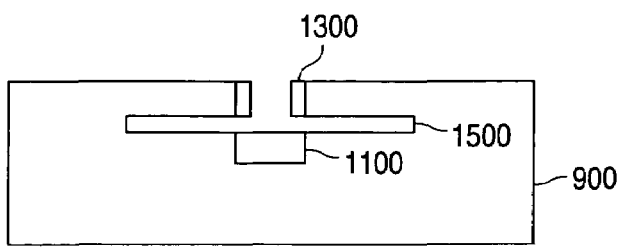

Thereafter, the laterally extending trench 1500 is etched in the <110> direction by making use of an anisotropic wet etch such as KOH with ethanol and water, or TMAH, etc. This is shown in FIG. 15.

Figure 16:
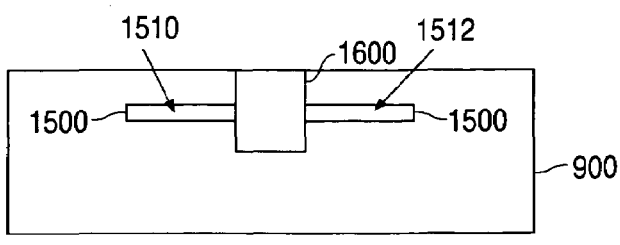

Thereafter, the rest of the organic fill plug is removed, e.g., using an oxygen plasma and cleaning with sulphuric acid or peroxide and followed by dilute HCL or peroxide. Thereafter, the resultant vertical trench is filled with isolation material such as PETEOS to define a STI region 1600 as shown in FIG. 16. It will be appreciated that if the vertical trench has a less aggressive aspect ratio, other insulating material with less step coverage can be used instead of PETEOS. The STI region 1600 is similar to either one of the regions 212, 214 of the FIG. 2 embodiment. In this embodiment, however, the laterally extending trench 1500 is not filled with insulating material as in the FIG. 2 embodiment but remains as an air gap that will exist between an extrinsic base that will subsequently be formed and a collector (not shown) of a BJT. It will be noted that a trench 1500 extends on either side of the STI region 1600 in FIG. 16. It will be appreciated that each of these two trenches (indicated as 1510 and 1512) will ultimately extend between an extrinsic base (that is formed in any standard way known in the art) and a collector (which is formed in the silicon material 900 in any standard way known in the art) of a separate BJT, the two BJTs lying adjacent to each other and isolated by the shallow trench isolation region 1600.

It will also be appreciated that while the present invention was described with respect to some specific embodiments, different embodiments may be adopted without departing from the scope of the invention as defined by the claims.

What is claimed is:

1. A method of forming a laterally extending trench in a semiconductor material underneath an extrinsic base of a bipolar transistor (BJT), comprising
   choosing a wafer with a <100> crystal orientation,
   etching a vertically extending shallow trench isolation (STI) region next to the extrinsic base, and
   using an anisotropic etchant to etch the laterally extending trench to extend laterally from the STI,
   wherein the crystal orientation is chosen so that the lateral trench extends in the <110> direction.

2. A method of claim 1, wherein the semiconductor material is silicon.

3. A method of claim 2, wherein the etchant is a wet anisotropic silicon etchant.

4. A method of claim 3, wherein the etchant includes KOH.

5. A method of claim 4, wherein the etchant further includes alcohol and water.

6. A method of claim 3, wherein the etchant includes TMAH.

\* \* \* \* \*